United States Patent
Hrametz et al.

(10) Patent No.: US 10,299,388 B2
(45) Date of Patent: *May 21, 2019

(54) LEAD-FREE SOLDER ALLOY FOR PRINTED CIRCUIT BOARD ASSEMBLIES FOR HIGH-TEMPERATURE ENVIRONMENTS

(71) Applicant: Halliburton Energy Services, Inc., Houston, TX (US)

(72) Inventors: Andrew Albert Hrametz, Rosenberg, TX (US); Alexander T. Duncan, Houston, TX (US)

(73) Assignee: Halliburton Energy Services, Inc., Houston, TX (US)

(*) Notice: Subject to any disclaimer, the term of this patent is extended or adjusted under 35 U.S.C. 154(b) by 346 days.

This patent is subject to a terminal disclaimer.

(21) Appl. No.: 15/146,356

(22) Filed: May 4, 2016

(65) Prior Publication Data

US 2016/0249462 A1 Aug. 25, 2016

Related U.S. Application Data

(60) Continuation of application No. 14/814,015, filed on Jul. 30, 2015, now Pat. No. 9,357,657, which is a (Continued)

(51) Int. Cl.
*H05K 3/34* (2006.01)
*C22C 13/02* (2006.01)
(Continued)

(52) U.S. Cl.
CPC ......... *H05K 3/3463* (2013.01); *B23K 35/262* (2013.01); *C22C 13/00* (2013.01);
(Continued)

(58) Field of Classification Search
CPC ........ B23K 35/26; B23K 35/262; H05K 3/34; H05K 3/3463
(Continued)

(56) References Cited

U.S. PATENT DOCUMENTS 5,346,775 A 9/1994 Jin et al.
9,167,704 B2 * 10/2015 Hrametz .............. B23K 35/262
(Continued)

FOREIGN PATENT DOCUMENTS

CA 2641812 C 6/2008
WO WO-2005099961 A1 10/2005
(Continued)

OTHER PUBLICATIONS

"U.S. Appl. No. 12/517,652, Response filed Jun. 5, 2012 to Final Office Action dated Jan. 19, 2012", 10 pgs.
(Continued)

*Primary Examiner* — Weiping Zhu
(74) *Attorney, Agent, or Firm* — Gilliam IP PLLC

(57) ABSTRACT

A solder alloy suitable for high temperature environments, such as for example electronic systems used in an oil or gas well where the temperature may be in the region of 175° C., the solder alloy having a Silver weight % in the range of 3.5 to 7.0, a Copper weight % in the range of 1.0 to 4.0, and an Antimony weight % in the range of 1.0 to 3.0. Other embodiments are described and claimed.

9 Claims, 2 Drawing Sheets

Related U.S. Application Data division of application No. 12/517,652, filed as application No. PCT/US2006/047586 on Dec. 13, 2006, now Pat. No. 9,167,704.

(51) Int. Cl.
*E21B 49/00* (2006.01)
*B23K 35/26* (2006.01)
*C22C 13/00* (2006.01)
*H05K 1/09* (2006.01)

(52) U.S. Cl.
CPC .............. *C22C 13/02* (2013.01); *E21B 49/00* (2013.01); *H05K 1/09* (2013.01); *H01L 2924/0002* (2013.01)

(58) Field of Classification Search
USPC .......................................................... 148/24
See application file for complete search history.

(56) References Cited

U.S. PATENT DOCUMENTS

| | | |
|---|---|---|
| 2005/0100474 A1 | 5/2005 | Huang et al. |
| 2005/0151233 A1 | 7/2005 | Deepak et al. |
| 2011/0052444 A1 | 3/2011 | Hrametz et al. |
| 2015/0328723 A1 | 11/2015 | Hrametz et al. |

FOREIGN PATENT DOCUMENTS

| | | |
|---|---|---|
| WO | WO-08073090 A1 | 6/2008 |
| WO | WO-2008073090 A1 | 6/2008 |

OTHER PUBLICATIONS

"U.S. Appl. No. 12/517,652 , Response filed Oct. 31, 2011 to Non Final Office Action dated Oct. 18, 2011", 8 pgs.
"U.S. Appl. No. 12/517,652, Advisory Action dated Jul. 9, 2012", 3 pgs.
"U.S. Appl. No. 12/517,652, Advisory Action dated Nov. 19, 2014", 3 pgs.
"U.S. Appl. No. 12/517,652, Examiner Interview Summary dated Apr. 16, 2015", 3 pgs.
"U.S. Appl. No. 12/517,652, Examiner Interview Summary dated Jun. 7, 2012", 3 pgs.
"U.S. Appl. No. 12/517,652, Final Office Action dated Jan. 19, 2012", 9 pgs.
"U.S. Appl. No. 12/517,652, Final Office Action dated Sep. 10, 2014", 8 pgs.
"U.S. Appl. No. 12/517,652, Non Final Office Action dated Jan. 9, 2015", 7 pgs.
"U.S. Appl. No. 12/517,652, Non Final Office Action dated Mar. 4, 2014", 8 pgs.
"U.S. Appl. No. 12/517,652, Non Final Office Action dated Oct. 18, 2011", 7 pgs.
"U.S. Appl. No. 12/517,652, Notice of Allowance dated Jun. 5, 2015", 8 pgs.
"U.S. Appl. No. 12/517,652, Response filed Mar. 15, 2011 to Restriction Requirement dated Feb. 22, 2011", 5 pgs.
"U.S. Appl. No. 12/517,652, Response filed May 8, 2015 to Non Final Office Action dated Jan. 9, 2015", 10 pgs.
"U.S. Appl. No. 12/517,652, Response filed Aug. 4, 2014 to Non Final Office Action dated Mar. 4, 2014", 8 pgs.
"U.S. Appl. No. 12/517,652, Response filed Nov. 10, 2014 to Final Office Action dated Sep. 10, 2014", 8 pgs.
"U.S. Appl. No. 12/517,652, Restriction Requirement dated Feb. 22, 2011", 5 pgs.
"U.S. Appl. No. 14/814,015, Notice of Allowance dated Feb. 5, 2016", 8 pgs.
"U.S. Appl. No. 14/814,015, Supplemental Preliminary Amendment filed Aug. 20, 2015", 5 pgs.
"Canadian Application Serial No. 2,641,812, Office Action dated Jun. 12, 2013", 2 pgs.
"Canadian Application Serial No. 2,641,812, Response filed Dec. 10, 2013 to Office Action dated Jun. 12, 2013", 10 pgs.
"European Application Serial No. 06849954.0, Extended European Search Report dated Nov. 24, 2010", 6 pgs.
"European Application Serial No. 06849954.0, Office Action dated Dec. 13, 2010", 1 pg.
"European Application Serial No. 06849954.0, Response filed Jun. 13, 2011 to Office Action dated Dec. 13, 2010", 14 pgs.
"International Application Serial No. PCT/US2006/047586, International Preliminary Report on Patentability dated Jun. 16, 2009", 4 pgs.
"International Application Serial No. PCT/US2006/047586, International Search Report dated Nov. 16, 2007", 1 pg.
"International Application Serial No. PCT/US2006/047586, Written Opinion dated Nov. 16, 2007", 3 pgs.

\* cited by examiner

LEAD-FREE SOLDER ALLOY FOR PRINTED CIRCUIT BOARD ASSEMBLIES FOR HIGH-TEMPERATURE ENVIRONMENTS

CROSS-REFERENCE TO RELATED APPLICATIONS

This application is a continuation application of U.S. patent application Ser. No. 14/814,015, filed on Jul. 30, 2015; which application is a divisional application of U.S. patent application Ser. No. 12/517,652, filed on Jun. 4, 2009, issued as U.S. Pat. No. 9,167,704 on Oct. 20, 2015, which application is a U.S. National Stage Filing under 35 U.S.C. § 371 from International Application No. PCT/US2006/047586, filed on Dec. 13, 2006, published as WO 2008/073090 on Jun. 19, 2008; the disclosures of which are incorporated herein by reference as if reproduced in their entireties.

FIELD

Embodiments of the present invention relate to solder alloys.

BACKGROUND

Solder is a ubiquitous product used in the electronic industry to attach electronic components, such as integrated circuit packages and passive components, to circuit boards, to electrically connect such electronic components to traces on a circuit board in order to realize electronic systems, and to help dissipate heat.

In some applications, electronic systems are expected to survive harsh conditions. For example, in the oil well logging industry, various tools are employed to investigate formation conditions, and such tools often employ sophisticated electronic systems. Wireline logging tools, logging-while-drilling tools, and other types of downhole tools often operate at temperatures from 150° C. to 175° C.

Lead (Pb) has long been a component of solder used in the electronic industry. Some governing bodies, such as the European Union, have banned solder in winch lead is a component because of the concern that the lead may pose an environmental and health hazard. It is expected that other governing bodies, or governments, may place taxes, restrictions, or bans on solder with lead. Because of this, there has been much research in developing lead-free solder for the electronics industry.

Accordingly, it is useful to provide a lead-free solder alloy suitable for high-temperature environments.

DESCRIPTION OF EMBODIMENTS

In the descriptions that follow, the scope of the term "some embodiments" is not to be so limited as to mean more than one embodiment, but rather, the scope may include one embodiment, more than one embodiment, or perhaps all embodiments.

High temperature thermal cycling and heat exposure commonly cause damage to a solder joint, generally resulting in changes to the solder microstructure over time, even though its appearance may seem the same. Changes to the solder microstructure usually affect the properties of the solder and the solder joint itself. Some known lead-free solders containing very large percentages of Tin (Sn) exhibit strong IMC (intermetallic compound) bonding and good IMC development, but it has been found that for some of these known solder alloys, exposure to temperatures in the region of 175° may accelerate rapid growth of and changes in the microstructure interfaces and in the IMC layers. The rapid intermetallic growth between interfacial layers creates diffusion voiding adjacent to the component leads and solder pads, which reduces the solder joint strength in these areas.

Figure 1:
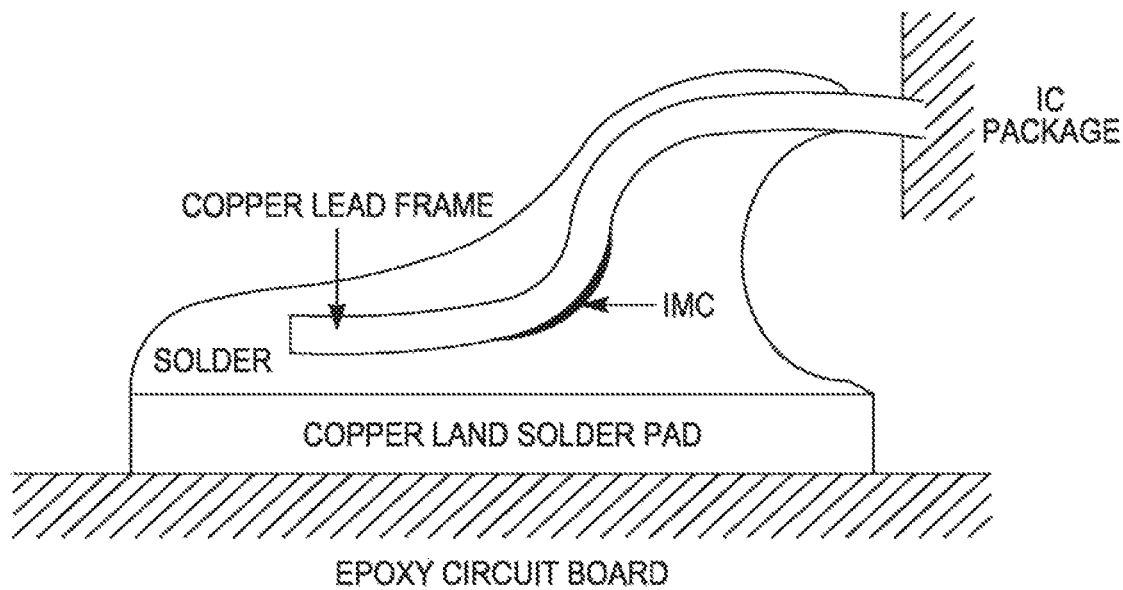
FIG. 1 illustrates a prior art normal solder joint.
Figure 2:
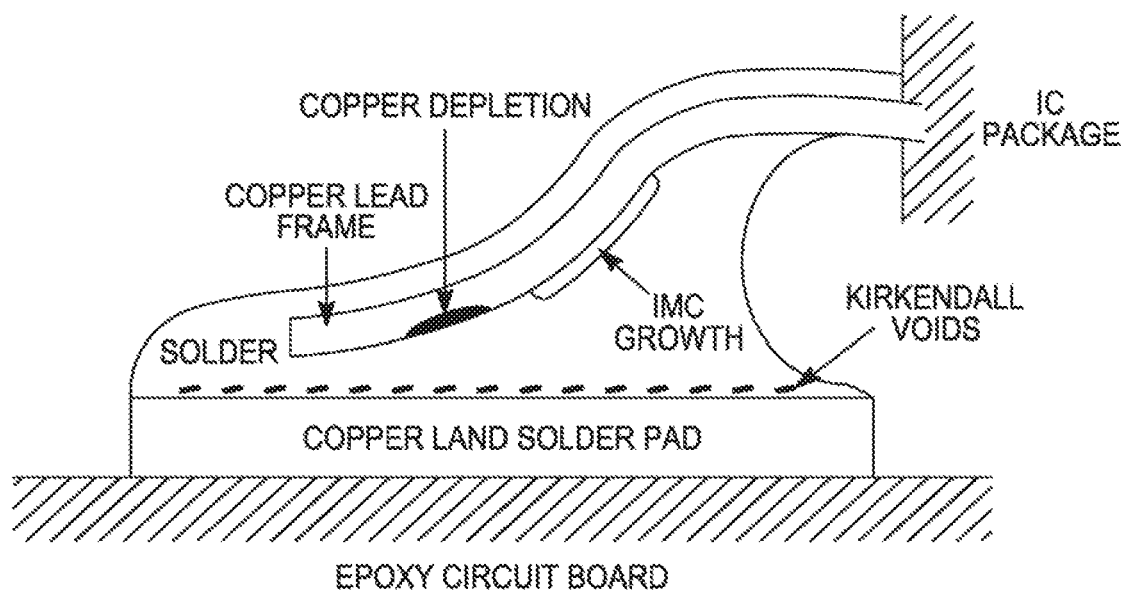
FIG. 2 illustrates a prior art solder joint with damage due to high temperature.

FIGS. 1 and 2 are simplified illustrations of typical photomicrographs of a solder joint. FIG. 1 illustrates a solder joint without damage. In FIG. 1, an integrated circuit (IC) package with a copper load frame is soldered to a copper land solder pad. The copper land solder pad is formed on an epoxy circuit board. FIG. 1 also illustrates an IMC layer. FIG. 2 illustrates typical damage that may occur to a solder joint at high temperature, such as for example 185° C. In FIG. 2, copper depletion is indicated, as well as extreme IMC growth. Furthermore, Kirkendall voids are indicated in FIG. 2.

It has been found that solder alloy having a range of 3.5 to 7.0 weight % Silver (Ag), a range of 1.0 to 4.0 weight % Copper (Cu), a range of 1.0 to 3.0 weight % Antimony (Sb), and where the remainder is Sn, has desirable properties in a high temperature environment, such as the environment experienced by a well logging tool. It is found that such solder alloys have a melting temperature above 175° C., and for some embodiments, the melting temperature is around 220° C. Such solder alloys have a relatively wide plastic range, i.e., the difference in liquidus and solidus temperatures may be relatively large for such solder alloys. However, this is not a problem in the high temperature environment of an oil or gas well.

Figure 4:
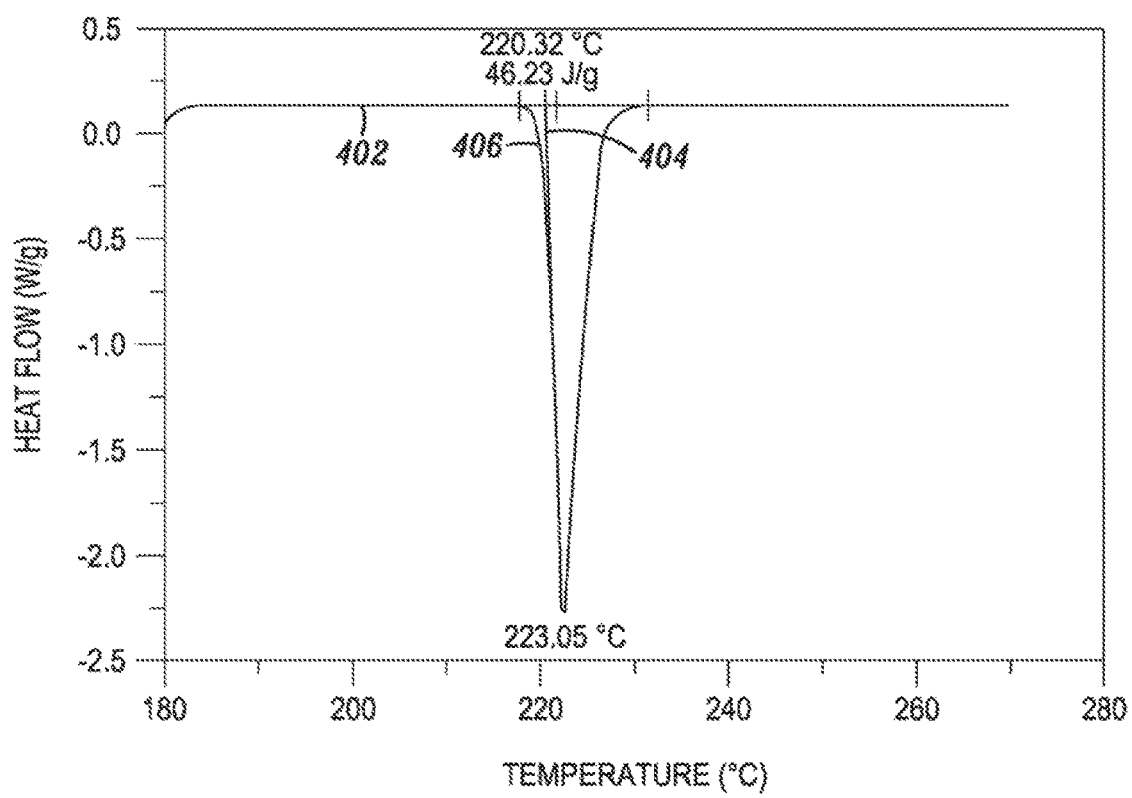
FIG. 4 illustrates a thermal analysis curve for an embodiment using differential scanning calorimetry.

As an example of a particular embodiment, a solder alloy may consist of 4.7 weight % Ag, 1.7 weight % Cu, 1.5 weight % Sb, and 92.1 weight % Sn. An example of a thermal analysis curve for such an embodiment is illustrated in FIG. 4, where the sample mass is 7.9 mg. The thermal analysis curve in as obtained by differential seal rang calorimetry. Line 402 may serve as a reference, indicating the heat flow when the sample is not experiencing it change in state. The sample is heated up in an adiabatic chamber with a reference sample that does not change state over the temperature measurement range. The x-axis is the temperature of the reference sample units of Celsius, and the y-axis measures heat flow in or out of the sample in units of watts/gram. Solidus is at around 219° C., where the sample begins to melt. Because general heat capacity increases at is phase transition, above the solidus, it is seen that the heat flow into the simple increases rapidly. The heat flow is negative, indicating that heat is flowing into the sample (endothermic). Line 404 is a tangent to curve 406, and the intersection at line 404 with reference line 402 may be taken as the melting point, which is about 220.32° C. As the sample is heated, it eventually turns into a liquid, where the liquidus is seen to be at around 232° C.

It is found that the addition of Sb slightly increases the solidus temperature. It is found that having more Cu may slow down IMC layer formation. The inclusion of Sb is found to make the solder stronger. That is, there is greater ductile strength and better resistance gradation so that changes in the solder properties due to time and temperature are mitigated. In addition to the above-cited elements, some embodiment solder alloys may have a trace amount of Zinc (Zn) in the range of 0.1 to 1.0 weight %. It has been found that Zn may slow down the formation of Kirkendall voids.

Standard techniques may be employed to manufacture the above-described embodiments into a solder paste. It is expected that the above-described embodiments may be used for solder in surface mount technology (SMT), or through-hole technology, and for various IC packages, such as ball grid array (BGA) packages, framelead and leadless frame packages, dual in-line packages (DIPs), small outline integrated circuits (SOICs), quad flat packages (QFPs), and chip scale packages (CSPs), to name a few. The above-described embodiments may also be used for passive and active components. Standard techniques may also be employed to manufacture wire-form solder having the disclosed compositions.

Before components are soldered to a board, the leads are often coated with a protective finish. The protective finish may need to be removed before soldering with an embodiment solder if there are elements in the protective finish that are not compatible with the embodiment solder. That is, the presence of some elements in the protective finish may degrade the resulting solder joint. For example, it is found that Indium, Lead, or Gold in a protective finish is not compatible. If the protective finish is not compatible, then it should be stripped off of the leads. Some protective finishes need not be removed, however. For example, a protective finish consisting of only Sn need not be removed.

Figure 3:
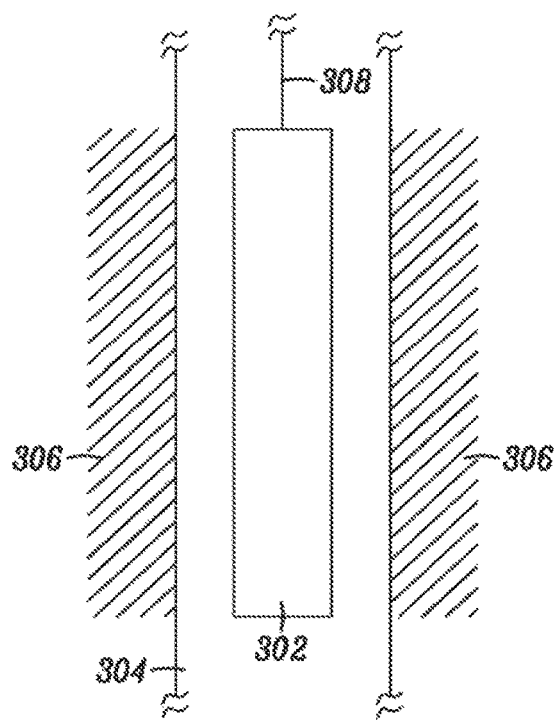
FIG. 3 illustrates a well logging tool employing an embodiment of the present invention.

It is expected that embodiments of the present invention may find application to various electronic systems used in relatively high temperature environments. As a particular example, it is expected that embodiments of the present invention may find application in electronic systems used in a well logging tool. Such an example application is illustrated in simple fashion in FIG. 3, where logging tool 302 in bole 304 measures various physical properties of formation 306. Well logging tool 302 may be a wireline tool, where wire 308 provides various signal information to instruments on the surface (not shown).

Various modifications may be made to the disclosed embodiments without departing from the scope of the invention as claimed below.

What is claimed is:

1. A circuit board comprising: one or more solder joints formed from a premelted solid lead-free wire-form solder having a preliminary solder alloy composition comprising:
    Silver;
    Copper;
    Antimony; and
    Tin;
    wherein the solder alloy composition has a weight % of the Silver in a range of 3.5 to 7.0, a weight % of the Copper in a range of 1.0 to 4.0, a weight % of the Antimony in a range of 1.0 to 3.0, and the remainder Tin.

2. The circuit board as set forth in claim 1, wherein the preliminary solid solder alloy composition has about 4.7 weight % Silver, about 1.7 weight % Copper, about 1.5 weight % Antimony, and the remainder Tin.

3. The circuit board as set forth in claim 2, wherein the preliminary solid solder composition further comprises Zinc.

4. The circuit board as set forth in claim 3, wherein the preliminary solid solder alloy composition has a weight % of the Zinc in a range of 0.1 to 1.0.

5. The circuit board as set forth in claim 4, wherein the preliminary solid solder alloy composition has a weight % of the Tin in a range of 85.0 to 94.4.

6. The circuit board as set forth in claim 4, wherein the preliminary solid solder alloy composition comprises 4.7 weight % Silver, 1.7 weight % Copper, and 1.5 weight % Antimony.

7. The circuit board as set forth in claim 1, wherein the preliminary solder alloy composition has a weight % of the Tin in a range of 86.0 to 94.5.

8. The circuit board as set forth in claim 1, wherein the preliminary solid solder alloy composition comprises at least 0.1 weight % Zinc.

9. The circuit board as set forth in claim 8, wherein the preliminary solid solder alloy composition has a weight % of the Zinc in a range of 0.1 to 1.0.

* * * * *